United States Patent [19]

Tomita et al.

[11] Patent Number: 5,391,439
[45] Date of Patent: Feb. 21, 1995

[54] LEADFRAME ADAPTED TO SUPPORT SEMICONDUCTOR ELEMENTS

[75] Inventors: Koji Tomita; Kazunori Kato, both of Tokyo; Jun Kato, Shizuoka, all of Japan

[73] Assignees: Dai Nippon Printing Co., Ltd.; Yamaha Corp., Japan

[21] Appl. No.: 191,714

[22] Filed: Feb. 4, 1994

Related U.S. Application Data

[63] Continuation of Ser. No. 17,988, Feb. 16, 1993, abandoned, which is a continuation-in-part of Ser. No. 765,981, Sep. 26, 1991, abandoned.

[30] Foreign Application Priority Data

Sep. 27, 1990 [JP] Japan ................ 2-258279

[51] Int. Cl.6 ........................................... H01L 23/495
[52] U.S. Cl. ..................................... 428/571; 428/600; 257/666
[58] Field of Search .................. 428/571, 572, 600; 257/666, 677; 228/170

[56] References Cited

U.S. PATENT DOCUMENTS

| | | | |
|---|---|---|---|
| 3,569,797 | 3/1971 | Simmons | 357/70 |
| 4,283,839 | 8/1981 | Gursky | 228/170 |
| 4,380,042 | 4/1983 | Angelucci et al. | 357/70 |
| 4,862,246 | 8/1989 | Masuda et al. | 357/70 |
| 4,920,074 | 4/1990 | Shimizu et al. | 357/70 |
| 5,029,386 | 7/1991 | Chao et al. | 357/70 |

FOREIGN PATENT DOCUMENTS

| | | | |
|---|---|---|---|
| 58-124255 | 7/1983 | Japan | 357/70 |
| 59-169162 | 9/1984 | Japan | 357/70 |
| 59-191363 | 10/1984 | Japan | 257/666 |
| 60-137048 | 7/1985 | Japan | 357/70 |
| 61-141165 | 6/1986 | Japan | 257/666 |
| 61-150358 | 7/1986 | Japan | 257/666 |
| 62-102549 | 5/1987 | Japan | 357/70 |
| 62-260349 | 11/1987 | Japan | 357/70 |
| 64-61041 | 3/1989 | Japan | 257/666 |
| 2-106059 | 4/1990 | Japan | 357/70 |
| 2-210854 | 8/1990 | Japan | 357/70 |
| 3-200358 | 9/1991 | Japan | 257/666 |

*Primary Examiner*—John Zimmerman
*Attorney, Agent, or Firm*—Parkhurst, Wendel & Rossi

[57] ABSTRACT

In a leadframe for supporting semiconductor devices and including a plurality of outer lead sections, a recess or recesses are provided on each of the outer lead sections at a central portion or both sides of each outer lead section in a region including a cutting line. The recess or recesses reduce the cross-sectional area of the lead section, thus enabling a new cut surface of the lead section to be well covered by solder and enabling ready cutting of the lead section.

11 Claims, 3 Drawing Sheets

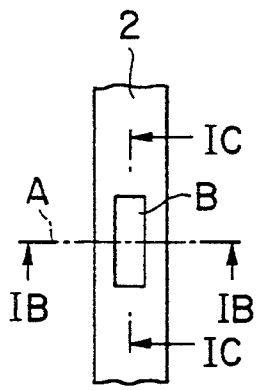 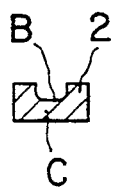 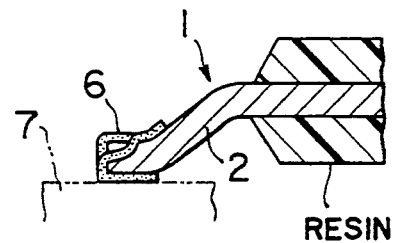
FIG. 1A    FIG. 1B    FIG. 1C
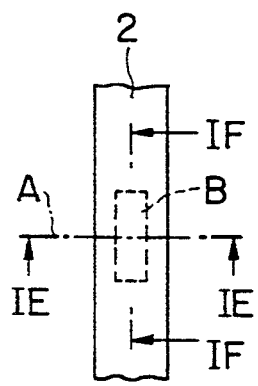 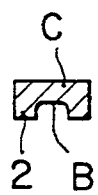 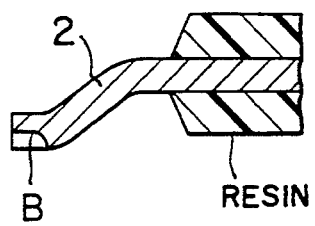
FIG. 1D    FIG. 1E    FIG. 1F
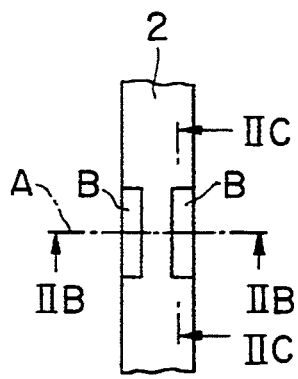 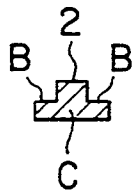 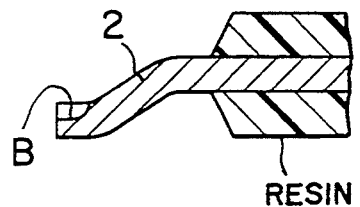
FIG. 2A    FIG. 2B    FIG. 2C

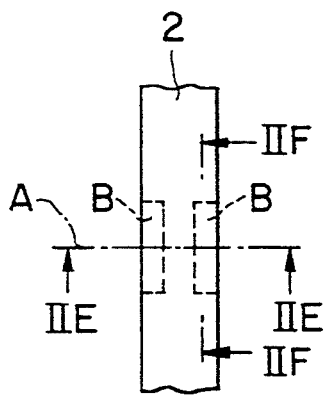 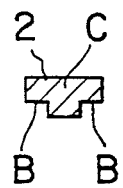 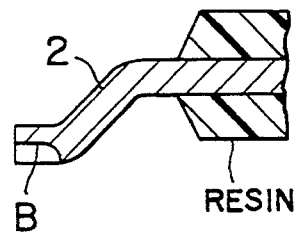
FIG. 2D     FIG. 2E     FIG. 2F
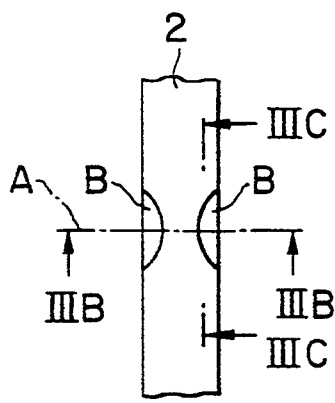 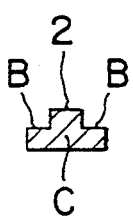 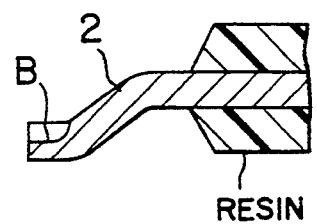
FIG. 3A     FIG. 3B     FIG. 3C
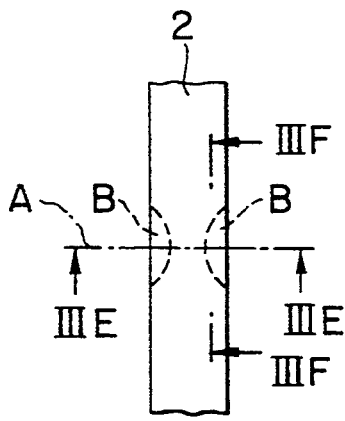 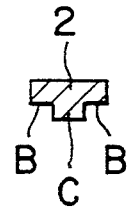 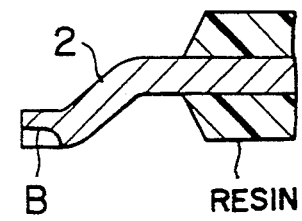
FIG. 3D     FIG. 3E     FIG. 3F

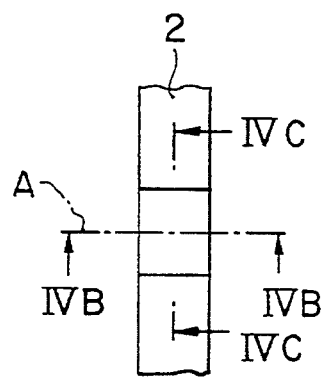
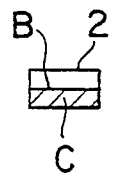
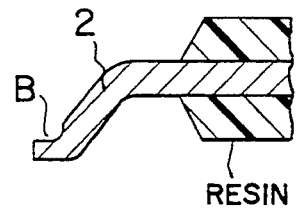
FIG. 4A  FIG. 4B  FIG. 4C
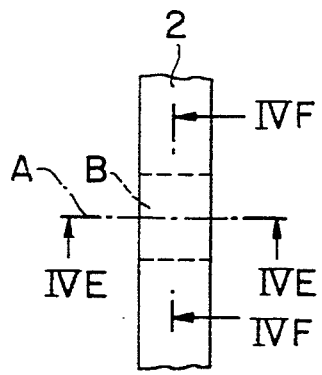
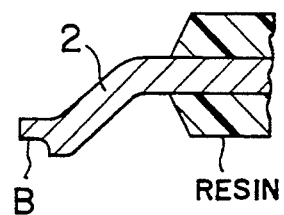
FIG. 4D  FIG. 4E  FIG. 4F
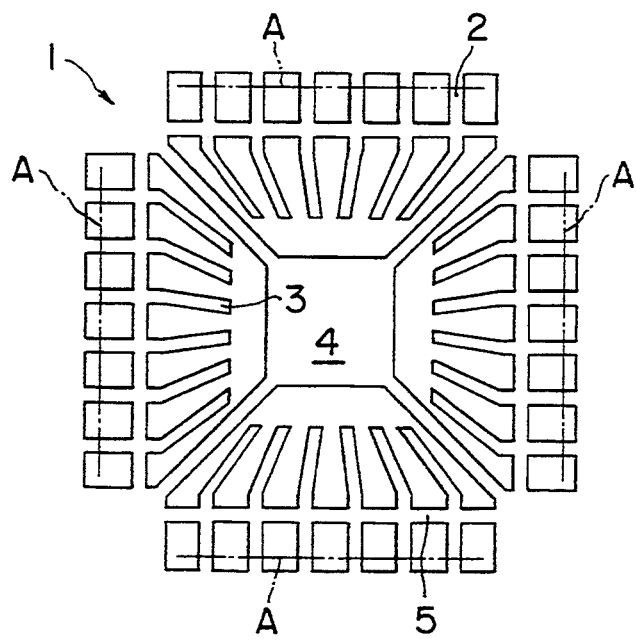
FIG. 5

LEADFRAME ADAPTED TO SUPPORT SEMICONDUCTOR ELEMENTS

This is a continuation of application Ser. No. 08/017,988, filed Feb. 16, 1993, now abandoned, which is a continuation-in-part of Ser. No. 07/765,981, filed Sep. 26, 1991, now abandoned.

BACKGROUND OF THE INVENTION

This invention relates to a leadframe adapted to support semiconductor devices, and, more particularly, to a leadframe which enables ready cutting of outer lead sections thereof and which decreases portions of the outer lead sections to which the solder does not adhere when they are connected to the printed circuit board. This invention relates also to a method of mounting the leadframe on a printed circuit board.

Leadframes for supporting semiconductor devices thereon have outer lead sections, inner lead sections and a central die pad portion. Semiconductor chips are mounted on the die pad portion, and the pads of the semiconductor chips and the inner lead sections are bonded together through wires. A plastic package type semiconductor device is formed by molding in a resin the inner lead sections and the die pad portion, with the outer lead sections exposed. The outer ends of the outer lead sections are plated with a solder for mounting the outer lead sections on a printed circuit board.

In recent years, there has been a tendency to increase the number of input and output terminals of semiconductor chips having various sizes. Especially, in electronic devices, it is strongly desired to reduce the size and weight of the devices. For this reason, efforts have been made to reduce the size of the electronic devices and to provide a greater number of pins for the electronic devices of the same size, that is, to decrease the pitch of the leads. For the reason described above, it has been desired to miniaturize the size of the leadframe for semiconductor devices.

In the gull-wing type leadframe, for example, before mounting the leadframe on a printed circuit board, it is necessary to cut the leadframe so as to electrically isolate outer lead sections. As a consequence, new metal surfaces are created at the cut portions of the outer lead sections so that when the leadframe is made of metal that is difficult to solder, there arises a problem that the solder does not perfectly adhere to or cover the new cut surfaces.

Moreover, as the pitch of the leads becomes small, the strength of the leads decreases so that it is necessary to increase the strength of the leads. As a consequence, in recent years, leadframes made of high strength materials having a Vickers hardness (Hv) higher than 250 are practically used. Because in many cases the outer lead sections are designed to have the same width and thickness as those of the leadframe, cutting punches will be broken, when a high strength material is used, thus decreasing the life of the cutting mold. This not only increases the number of times the punches must be ground but also increases the assembling cost. Moreover, as the pitch of the leads becomes fine, the tool utilized for cutting the outer leads becomes fine so that the punches are more liable to be broken, thus shortening the life of the cutting mold.

SUMMARY OF THE INVENTION

Accordingly, it is an object of this invention to provide a novel leadframe which is capable of reducing the portions of the outer lead sections where the solder does not adhere well when mounting the leadframe on the print circuit board, and which enables ready cutting of the outer lead sections and prolongation of the life of the cutting mold.

A further object of this invention is to provide a method of mounting the leadframe on a printed circuit board, which is more reliable than conventional methods.

According to this invention, there is provided a leadframe including a plurality of outer lead sections having outer ends to be cut along a cutting line before mounting on a printed circuit board, each of said outer lead sections being formed with recess means to provide a thinned portion or portions in a region including said cutting line.

The recess may be formed at a central portion or on both sides of each outer lead.

According to this invention, there is provided a method of mounting a leadframe having outer lead sections on a printed circuit board, comprising the steps of providing a recess or recesses on a surface of each of the outer lead sections, cutting each outer lead section across the region of said recess or recesses to expose a new cut surface, and causing a solder applied to the outer lead section to flow onto the new cut surface to cover the same when each outer lead section is mounted on the printed circuit board by soldering.

Embodiments of this invention will now be described with reference to the accompanying drawings.

BRIEF DESCRIPTION OF THE DRAWINGS

FIG. 1A is a fragmentary plan view of an outer lead of the leadframe according to an embodiment of this invention;

FIG. 1B is a cross-sectional view taken along the line IB—IB of FIG. 1A;

FIG. 1C is a side view, in vertical section, of the outer lead of FIG. 1A;

FIGS. 1D, 1E and 1F are a plan view, a cross-sectional view and a side view, respectively, of a modification of the embodiment shown in FIGS. 1A through 1C;

FIGS. 2A, 2B and 2C are a plan view, a cross-sectional view and a side view, respectively, of a second embodiment of this invention;

FIGS. 2D, 2E and 2F are a plan view, a cross-sectional view and a side view, respectively, of a modification of the second embodiment;

FIGS. 3A, 3B and 3C are a plan view, a cross-sectional view and a side view, respectively, of a third embodiment of this invention;

FIGS. 3D, 3E and 3F are a plan view, a cross-sectional view and a side view, respectively, of a modification of the third embodiment;

FIGS. 4A, 4B and 4C are a plan view, a cross-sectional view and a side view, respectively, of a fourth embodiment of this invention;

FIGS. 4D, 4E and 4F are a plan view, a cross-sectional view and a side view, respectively, of a modification of the fourth embodiment; and FIG. 5 is a plan view showing an example of a leadframe.

DESCRIPTION OF THE PREFERRED EMBODIMENTS

As shown in FIG. 5, a leadframe 1 used to assemble a semiconductor package is formed of outer lead sections 2, inner lead sections 3, and a die pad portion 4. The outer ends of the outer lead sections 2 are interconnected with each other by a dam bar 5. The outer lead sections 2, inner lead sections 3 and die pad portion 4 are integrally formed by a photoetching or stamping method by using metal materials having a high electroconductivity and a high mechanical strength, such as Kovar, Alloy 42, and a copper alloy. In a leadframe 1 manufactured by the above method, semiconductor chips are mounted on the die pad portion 4, and the pads of the semiconductor chips and the inner lead sections 3 are bonded together through wires as will be described later. A plastic package type semiconductor device is formed by molding in a resin the inner lead sections 3 and the die pad portion 4 while maintaining the outer lead sections in an exposed state. In this construction, the outer ends of the outer lead sections are plated with a solder for mounting the outer lead sections on a printed circuit board.

The outer lead sections 2 of the leadframe shown is cut along cutting lines A to electrically isolate the leads 2. As a consequence, new metal surfaces appear at the cut portions of the leads 2. It is difficult to solder the new metal surfaces as mentioned hereinbefore.

FIGS. 1A through 4F will now be referred to for a description of the embodiments of this invention.

In these figures, only the outer lead sections 2 of the leadframe of this invention are shown, but it should be understood that other elements not shown in these figures are identical to those shown in FIG. 5.

The leadframes 1 shown in these figures are made of high strength material such as HT-Kovar (available from YAMAHA CORPORATION, Japan).

As shown in FIG. 1A, at the central portion of a gull-wing type outer lead 2 at which the lead 2 is cut along the line A (FIG. 5) is formed a rectangular thin portion which is produced by forming a rectangular recess B on the upper or front surface of the lead 2. This recess can be formed by a so-called half etching treatment. The half etching is carried out by subjecting the lead 2 to an etching treatment with the portion of the recess not covered by a photoresist. When the outer lead 2 is cut along the cutting line A a new metal surface C will appear at the cut end of recess B, as shown in FIG. 1B.

At the time of cutting the outer lead sections 2 and soldering the outer leads to a printed circuit board 7 of a surface mounting type, for example, a soldering material 6, which is preliminarily applied to the lead 2, is caused to flow to cover the new surface C. Especially, the soldering material 6 will substantially completely cover the cut surface C as shown in FIG. 1C. As a consequence, even when the leadframe 1 is made of a material to which the solder will not readily adhere, the solder will positively adhere to the new surface C when mounting a plastic package on the printed circuit board. As shown in FIG. 1C, the rear surface of the laterally projecting end of each outer lead 2 is soldered in face-to-face relation to the printed circuit board 7 of the surface mounting type.

By providing the recess to reduce the cross-sectional area, even when the leadframe is made of a high strength material, the outer lead 2 can be cut readily. Accordingly, the life of the cutting mold can be prolonged which decreases the number of grinding operations of the cutting mold.

In a modification shown in FIGS. 1D through 1F, the rectangular recess B is formed at the central portion of the rear surface of the outer lead 2. Also in this modification, the leadframe 1 operates in the same manner as described with reference to FIG. 1A through 1C.

FIGS. 2A through 2C show a second embodiment of this invention. As shown, rectangular recesses B are formed on the upper or front surface of the outer lead 2, while, in a modification shown in FIGS. 2D through 2F recesses B are formed on the rear surface of the outer lead 2. In the embodiment and its modification shown in FIGS. 2A through 2F, the recesses B are formed on both sides of the outer lead 2 so that the lead is thinned at the two sides. The leadframes 1 shown in FIGS. 2A through 2F operate in the same manner as that shown in FIGS. 1A through 1F.

In the leadframes 1 shown in FIGS. 3A through 3F, recesses B are formed on both sides of the upper or front surface (FIGS. 3A through 3C) or the rear surface (FIGS. 3D through 3F) of the outer lead 2. However, in this embodiment and its modification, the recesses B are cut out arcuately. The leadframe 1 according to this embodiment and its modification operates in the same manner as those of the previous embodiments.

In the leadframe 1 shown in FIGS. 4A through 4F, a recess B formed on the upper or rear surface of the outer lead 2 has the same width as that of the outer lead 2. The leadframes 1 according to this embodiment and its modification operate in the same manner as those shown in the previous embodiments.

FIGS. 1F, 2C, 2F, 3C, 3F, 4C and 4F do not show the soldering material 6 as shown in FIG. 1C, but it will be understood that the soldering material 6 simply has been omitted from these figures.

QFP leadframes 1 shown in FIGS. 1A–1F through FIGS. 4A–4F were manufactured and subjected to tests. Table 1 below shows a result of the tests regarding the number of cuttings carried out until the cutting mold needed grinding, while Table 2 shows a result of calculations of the areas to which solder did not adhere fully at the time of mounting the leadframe 1 on the printed circuit board. Materials of the leadframes used for the tests were Alloy 42 (Hv=200, tensile strength=65 kg/mm$^2$) and HT-Kovar (product of YAMAHA CORPORATION, Japan)(Hv=310, tensile strength=110 kg/mm$^2$).

TABLE 1

| Number of cuttings per one grinding operation of outer lead cutting mold | | | |
|---|---|---|---|
| Leadframe | | Alloy 42 | HT-Kovar |
| Conventional leadframe | | one grinding/ one million | one grinding/ 0.6 million |
| This invention FIGS. 1A–1F | Front surface etching | one/1.3 million | one/0.80 million |
| | Rear surface etching | one/1.35 million | one/0.82 million |
| This invention FIGS. 2A–2F | Front surface etching | one/1.50 million | one/0.90 million |
| | Rear surface etching | one/1.55 million | one/0.92 million |
| This invention FIGS. 3A–3F | Front surface etching | one/1.80 million | one/1.10 million |
| | Rear surface etching | one/1.85 million | one/1.12 million |
| This invention FIGS. 4A–4F | Front surface etching | one/2.20 million | one/1.30 million |
| | Rear surface | one/2.30 | one/1.35 |

TABLE 1-continued

Number of cuttings per one grinding operation of outer lead cutting mold

| Leadframe | Alloy 42 | HT-Kovar |
|---|---|---|
| etching | million | million |

TABLE 2

Area to which leadframes solder did not adhere at the time of mounting (28 pins: SOP)

| Leadframe | | Percentage of area to which solder did not adhere |
|---|---|---|
| Conventional leadframe | | 5.6% |
| This invention FIGS. 1A–1F | Front surface etching | 0.8% |
| | Rear surface etching | 1.8% |
| This invention FIGS. 2A–2F | Front surface etching | 0.5% |
| | Rear surface etching | 0.9% |
| This invention FIGS. 3A–3F | Front surface etching | 0.4% |
| | Rear surface etching | 0.8% |
| This invention FIGS. 4A–4F | Front surface etching | 0.0% |
| | Rear surface etching | 0.0% |

As can be clearly noted, according to the leadframe of this invention, the area to which the solder does not adhere well can be greatly reduced.

According to the present invention, after the outer lead sections are cut along the recess, there is provided in the outer lead section means for receiving solder which has substantially a constant cross-sectional area even if errors arise in positioning the outer lead sections in a cutting die. Since the recess extends transversely to the cutting line or longitudinally of each outer lead section, and has a substantially flat bottom which extends along the length of the outer lead section in substantially parallel relation to the major surfaces of the outer lead section, if misalignment occurs while placing the outer lead section in the cutting die, a cut surface having a substantially constant cross-sectional area will still result. Thus, minor errors in positional alignment which would move the cutting line along the length of the outer lead section will result in a new cut metal surface having a substantially constant cross-sectional area to be soldered. The shape of the recess also provides superior retaining means for receiving solder therein to ensure a successful soldering operation. Furthermore, the half-etched recess is formed to provide a cross-sectionally reduced portion or portions without decreasing the areas of the outer lead sections projected onto the printed circuit board surface. This means that even if the recess means is formed the projection area of each outer lead section on the printed circuit board does not decrease so that the strength of soldering each outer lead section to the printed circuit board is not decreased.

The configurations of the recess B are not limited to those shown in the embodiments and can take any other desired configuration.

In the leadframe according to this invention, since a recess or recesses are provided for the cut portion of the outer lead, the area to which solder does not adhere to the outer lead can be decreased so that the solder completely covers the outer lead at the time of mounting, thus ensuring reliable electrical and mechanical connection.

Furthermore, since the absolute area of the newly exposed metal surface is small due to the provision of the recess or recesses even when the leadframe is made of high strength material, the outer lead can be readily cut so that the usable life of the cutting mold can be prolonged. Further, the provision of recess or recesses decreases the stresses caused at the time of cutting.

What is claimed is:

1. A leadframe provided with a plurality of outer lead sections of an elongated shape having outer ends to be cut along a cutting line before mounting, by soldering, said outer lead sections on a printed circuit board, each of said outer lead sections being formed with half-etched recess means providing means for receiving solder in a soldering region including said cutting line, each of said outer lead sections having a length, a width, a thickness and opposite front and rear major surfaces, said rear major surface being adapted to be soldered to said printed circuit board in face-to-face contact, said recess means comprising an elongated, substantially rectangular groove formed in said rear major surface and extending along said length transversely to said cutting line and centrally of the width of each outer lead section, said groove having a substantially flat, elongated bottom which extends along said length in substantially parallel relation to said major surfaces and which is located in an intermediate position of said thickness.

2. The leadframe according to claims 1, wherein said groove has an arcuate portion connecting said flat bottom and said rear major surface.

3. A leadframe provided with a plurality of outer lead sections of an elongated shape having outer ends to be cut along a cutting line before mounting, by soldering, said outer lead sections on a printed circuit board, each of said outer lead sections being formed with half-etched recess means for providing means for receiving solder in a soldering region including said cutting line, each of said outer lead sections having a length, two side edges, a thickness and opposite front and rear major surfaces, said rear major surface being adapted to be soldered to said printed circuit board in face-to-face contact, said recess means comprising a pair of elongated, substantially rectangular cutouts formed in said front major surface and extending along the respective side edges of each outer lead section transversely to said cutting line, each of said cutouts having a substantially flat, elongated bottom which extends along said length in substantially parallel relation to said major surfaces and which is located in an intermediate position of said thickness.

4. The leadframe according to claim 3, wherein each of said cutouts has an arcuate portion connecting said flat bottom and said front major surface.

5. A leadframe provided with a plurality of outer lead sections of an elongated shape having outer ends to be cut along a cutting line before mounting, by soldering, said outer lead sections on a printed circuit board, each of said outer lead sections being formed with half-etched recess means for providing means for receiving solder in a soldering region including said cutting line, each of said outer lead sections having a length, two side edges, a thickness and opposite front and rear major surfaces, said rear major surface being adapted to be soldered to said printed circuit board in face-to-face contact, said recess means comprising a pair of elongated, substantially rectangular cutouts formed in said rear major surface and extending along the respective side edges of each outer lead section transversely to said cutting line, each of said cutouts having a substantially flat, elongated bottom which extends along said length in substantially parallel relation to said major surfaces and which is located in an intermediate position of said thickness.

6. The leadframe according to claim 5, wherein each of said cutouts has an arcuate portion connecting said flat bottom and said rear major surface.

7. A leadframe provided with a plurality of outer lead sections of an elongated shape having outer ends to be cut along a cutting line before mounting, by soldering, said outer lead sections on a printed circuit board, each of said outer lead sections being formed with half-etched elongated recess means which provide means for receiving solder in a soldering region including said cutting line, each of said outer lead sections having a length, a width and opposite major surfaces, said recess means extending transversely to said cutting line and having a substantially flat, elongated bottom which extends along said length in substantially parallel relation to said major surfaces, said recess means being of an elongated shape and extending along two sides of each outer lead section, respectively.

8. The leadframe according to claim 7, wherein said recesses are formed on a front surface of each outer lead section.

9. The leadframe according to claim 7, wherein said recesses are formed on a rear surface of each outer lead section.

10. The leadframe according to claim 7, wherein each of said recesses is an arcuate cutout.

11. The leadframe according to claim 7, wherein each of said recesses is of a rectangular shape.

* * * * *